United States Patent [19]
McGuire

[11] Patent Number: 5,345,187
[45] Date of Patent: Sep. 6, 1994

[54] DUAL FREQUENCY DEMODULATION APPARATUS FOR FREQUENCY SHIFT KEYED (FSK) DATA SIGNALS AND FM SIGNALS AND METHOD THEREFOR

[76] Inventor: Ronald F. McGuire, Rt. 1 Box 34, Rixeyville, Va. 22737

[21] Appl. No.: 943,689
[22] Filed: Sep. 11, 1992
[51] Int. Cl.$^5$ ............................................. H03D 3/00
[52] U.S. Cl. ..................................... 329/302; 375/80; 375/88
[58] Field of Search ............... 329/300, 301, 302, 303, 329/323, 325; 375/80, 88, 89, 90, 91; 455/205, 337; 328/134, 140, 141

[56] References Cited

U.S. PATENT DOCUMENTS

| | | | |
|---|---|---|---|
| 2,379,748 | 7/1945 | Roberts | 455/337 X |
| 2,770,727 | 11/1956 | Hupert et al. | 329/323 |
| 3,325,731 | 6/1967 | Headle | 328/134 X |
| 3,858,117 | 12/1974 | Denny . | |
| 3,921,084 | 11/1975 | Kratt, III et al. | 329/300 X |
| 4,054,842 | 10/1977 | Elliott . | |
| 4,090,145 | 5/1978 | Webb . | |
| 4,156,194 | 5/1979 | Mueller . | |
| 4,247,943 | 1/1981 | Malm . | |
| 4,254,503 | 3/1981 | Vance . | |
| 4,290,140 | 9/1981 | Malm . | |
| 4,409,593 | 10/1983 | Bose . | |
| 4,726,041 | 2/1988 | Prohaska et al. . | |
| 4,814,717 | 3/1989 | Hooijmans . | |
| 4,825,452 | 4/1989 | Wong . | |
| 4,935,940 | 6/1990 | Reindl . | |
| 5,081,644 | 1/1992 | Uchida et al. . | |

OTHER PUBLICATIONS

Luff et al., "A Single-Chip VHF and UHF Receiver for Radio Paging", International Solid State Circuits (U.S.A. 1991). ISSCC91/Session 7/Communications/-Paper TA7.2/2 Feb. 91.

Primary Examiner—David Mis
Attorney, Agent, or Firm—James Creighton Wray

[57] ABSTRACT

The present invention provides an apparatus and method for dual frequency demodulation of frequency shift keyed data signals and linear FM signals. A carrier frequency and first and second side bands are divided and multiplied by first and second local oscillators having different frequencies above and below the carrier frequency. The first oscillator frequency Fx1 is between the lower range F0 of the signal and the carrier frequency FC, and the second oscillator frequency Fx2 is provided between the upper range F1 of the signal and the carrier frequency FC, wherein $F0<Fx1<FC<Fx2<F1$. The multiplied divided signals are filtered and amplified and converted to either digital data prior to being read by a digital reader, such as a comparator or a conventional differential operational amplifier or linear signals by demodulating FM signals. The invention eliminates the need for intermediate frequency bandpass filters, and uses only low pass filters which can be incorporated into a monolithic integrated circuit as provided by the present invention.

20 Claims, 5 Drawing Sheets

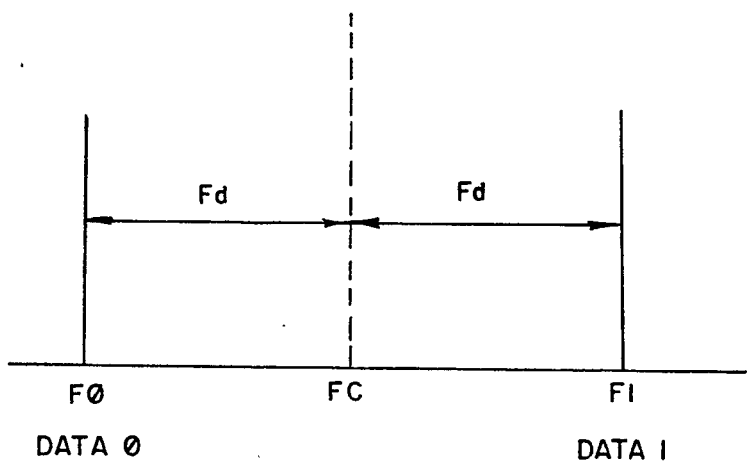

FIG. 1

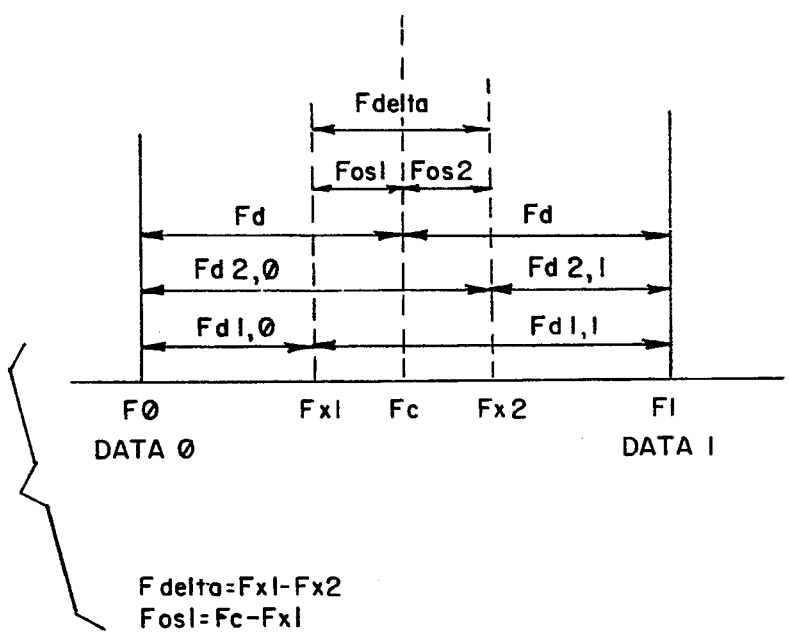

FIG. 2

$F_{delta} = F_{x1} - F_{x2}$
$F_{os1} = F_c - F_{x1}$
$F_{os2} = F_{delta} - F_{os1}$
$F_c$ = CARRIER FREQUENCY
$F_0$ = FREQUENCY FOR DATA 0
$F_1$ = FREQUENCY FOR DATA 1
$F_d$ = DEVIATION FREQUENCY
$F_{x1}$ = LOCAL OSCILLATOR FREQUENCY #1
$F_{x2}$ = LOCAL OSCILLATOR FREQUENCY #2
FOLLOWING ASSUMES $F_0$ = DATA 0; $F_1$ = DATA 1

$F_{d\,1,0}$ = FREQUENCY OUTPUT OF MIXER 1 FOR A DATA ZERO
$F_{d\,1,1}$ = FREQUENCY OUTPUT OF MIXER 1 FOR A DATA ONE
$F_{d\,2,0}$ = FREQUENCY OUTPUT OF MIXER 2 FOR A DATA ZERO
$F_{d\,2,1}$ = FREQUENCY OUTPUT OF MIXER 2 FOR A DATA ONE
NOTE: THE DESIGNATION OF THE DATA STATE
OF $F_0$ AND $F_1$ IS ARBITRARY

5,345,187

DUAL FREQUENCY DEMODULATION APPARATUS FOR FREQUENCY SHIFT KEYED (FSK) DATA SIGNALS AND FM SIGNALS AND METHOD THEREFOR

BACKGROUND OF THE INVENTION

The present invention relates to frequency shift keying (FSK) demodulating circuits and FM demodulation circuits and FM demodulation circuits.

It would be highly desirable to be able to build a complete radio frequency receiver without having to use conventional intermediate-frequency (IF) bandpass filters. Conventional IF filters are comparatively large in size as compared to the other components that are used in a receiver and typically the most expensive component used in the receiver. In addition, the technology of such filters does not lend itself to being incorporated on an integrated circuit. Therefore, the "single-chip" RF receivers currently being offered use external IF filters to function.

There has been interest in the past few years in so-called "zero IF" technology. With this technology, the local oscillator frequency injected into the mixer would be phase-locked to the transmitted signal's carrier frequency. This folds the sideband signals into a signal space from DC to the information cut-off frequency, thereby eliminating the need for conventional IF bandpass filters and allowing the design to use only low pass filters which can be incorporated into a monolithic integrated circuit. However, the approaches tried thus far have used a phased locked oscillator to lock the local-oscillator to the incoming carrier frequency and then to demodulate the signal by using a local oscillator frequency which has two outputs that are in phase quadrature with each other as mixer frequencies to demodulate an in-phase and a quadrature phase channel. The demodulator then discriminates between the folded sidebands created by each oscillator term by decoding the phase information in the demodulated sidebands.

FSK and FM receivers are commonly used in many applications. Primary uses of the present invention are for paging receivers and demodulation of conventional analog FM modulation.

SUMMARY OF THE INVENTION

The present demodulation technique uses two local oscillator frequencies that are not the same frequency and do not have to be phase-locked to either the incoming carrier frequency or to each other.

A primary object of the present invention is to preclude the need for external IF filters. In its preferred embodiment, a carrier frequency is mixed down to quasi-DC such that monolithic low pass filters can be used which can be incorporated on the same chip as the receiver circuit.

Another object of the present invention is to preclude the need for phase-locked oscillators. The user chooses frequencies such that oscillator frequency variances due to aging, temperature, doppler shifts, or other effects do not cause the local oscillator frequencies to vary such that the demodulated signal is higher in frequency than the cut-off frequency of the low pass demodulator filters. In actual practice, comparative trade-off evaluations of spacing between the mixer frequencies show that the greater the frequency difference between the filter, the greater the voltage difference between the demodulated states as seen at the comparator input. This frequency difference also increases the required band width of the low pass demodulator filters.

Another primary object of the invention is to provide a simple frequency-to-voltage converter, such as multivibrators with matched pulse widths, which could be used as the frequency-to-voltage converter. In one embodiment, the outputs and the resulting voltages are integrated and compared by using a comparator to determine the data state, i.e. a zero or one output, which is all that would be required to discriminate between FSK tones. Alternatively, any means to determine which mixer had the highest frequency present is acceptable.

The present invention makes it is possible that a receiver design based upon this technique can be incorporated onto a single chip receiver design, eliminating the need for external filters.

In a preferred embodiment, the invention provides an apparatus for dual frequency demodulation of frequency shift keyed (FSK) data signals. A carrier frequency filter is centered on a carrier frequency. An amplifier amplifies a signal from the filter and a power divider divides the amplified signal into first and second divided outputs. First and second mixers are provided on the first and second divided outputs. The mixers have local oscillators which vary in frequencies which are used to multiply the divided outputs. First and second multiplied output filtering and amplifying means are provided on the first and second multiplied outputs. First and second frequency-to-voltage converters are provided for converting the filtered and amplified multiplied output frequencies to digital data. A digital output reading means is provided for reading the digital output of the first and second converters.

Preferred output filters and amplifiers are low pass filters and low frequency amplifiers.

A preferred digital output reading means is a comparator.

The signal filter is centered on a carrier frequency and has a minimum pickup broad enough in frequency response to pass the carrier frequency, as well as given upper and lower side band frequencies.

The first and second local oscillators have differing frequencies centered on the carrier frequency. Preferably one of the oscillator frequencies is greater than the carrier frequency, and the other oscillator frequency is less than the carrier frequency. In its preferred embodiment, the first and second oscillator frequencies are within the minimum range of the signal filter. The frequency differences between the first local oscillator and the carrier frequency and the second local oscillator and the carrier frequency are preferably equal.

A method for dual frequency demodulation for frequency shift keyed data signals uses a power divider for dividing a signal into first and second outputs. First and second mixers have first and second local oscillators respectively multiplied by the signals of the first and second outputs. The first and second oscillators are provided with differing frequencies for multiplying the divided outputs. The first and second oscillators have frequencies above and below the carrier frequency respectively. First and second frequency-to-voltage converters are provided for converting the multiplied divided outputs to digital data. A digital data reading means is provided for reading outputs of the first and second converters for demodulation of the signal.

First and second low pass filters and first and second low frequency amplifiers are provided for filtering and amplifying the first and second multiplied outputs prior to conversion to digital data.

The preferred digital data reading means is a comparator.

An antenna receives the signal, and a filter filters from the received signal a signal centered on the carrier frequency. An amplifier amplifies the filtered signal prior to entering the power divider.

These and further and other objects and features of the invention are apparent in the disclosure, which includes the above and ongoing written specification, with the claims and the drawings.

BRIEF DESCRIPTION OF THE DRAWINGS

FIG. 1 shows a frequency shift keyed (FSK) spectrum based on a carrier frequency FC and upper and lower side bands F0 and F1, respectively.

FIG. 2 describes a frequency relationship with the upper and lower side bands centered around the carrier frequency FC and local oscillator frequencies Fx1 and Fx2, having deviation Fos1 and Fos2 from the carrier frequencies which are equal.

DETAILED DESCRIPTION OF THE DRAWINGS

FIG. 1 shows a frequency shift keyed (FSK) signal spectrum consisting of the carrier frequency Fc, the lower sideband F0, and the upper sideband F1. In this description, F0 is designated as representing a data 0 and F1 is designated as representing a data 1. The spectrum as shown in FIG. 1 is idealized. In a preferred embodiment, the actual spectrum is two SINX/X spectrums centered on F0 and F1 with spectral components a function of the data signal.

FIG. 1 shows the spectral components of a FSK signal spectrum and the relationship of the two local oscillator signals to each other. Fc, F0 and F1 are the carrier, lower, and upper sideband signals of a FSK signal; whereas Fx1 and Fx2 are the two local oscillator frequencies.

Figure 5:
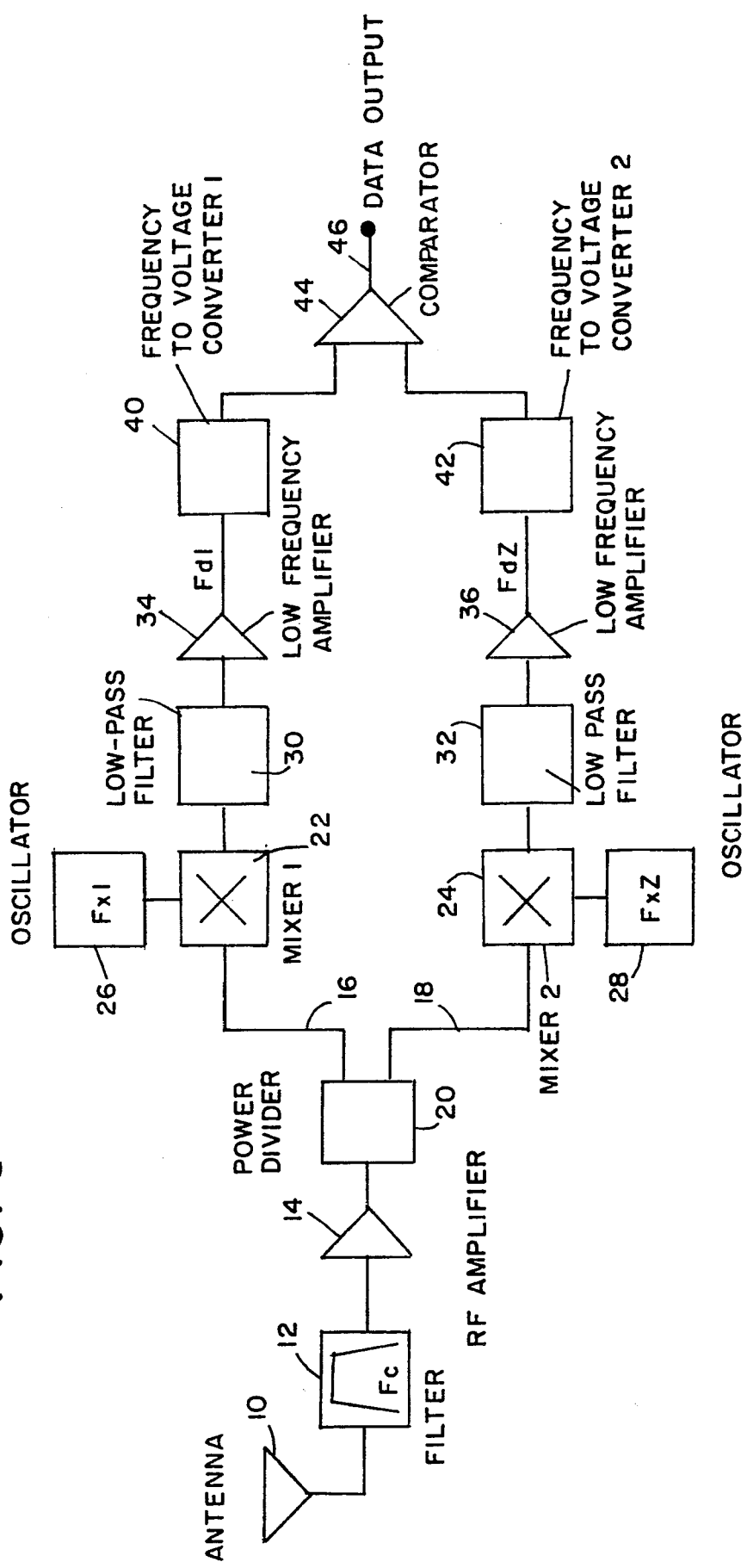
FIG. 5 is a diagram showing the components of a preferred embodiment of the present invention, with signal reception, division, multiplication, conversion and demodulation.

The demodulation technique proposed in this memorandum is shown in FIG. 5. The FSK signal is received by the antenna 10 and isolated from other signals by the filter 12 which is centered at the carrier frequency Fc and which, at a minimum, is broad enough in frequency response to pass Fc and the sidebands F0 and F1. The signal is typically amplified by an RF amplifier 14. Up to this point, the signal has been processed in a normal and typical manner; however, at this point the signal is divided, and the outputs 16 and 18 of the power divider 20 are sent to two mixers 22 and 24. In each of the two mixers, the received signal is multiplied by a local oscillator signal; however, this demodulation technique uses two local oscillators 26 and 28 at frequencies (Fx1 and Fx2) that are different in frequency from each other, which represents a unique approach. The signals from the mixers are fed to low pass filters 30 and 32 and to low frequency amplifiers 34 and 36. The output signals Fd1 and Fd2 are converted to voltages in frequency-to-voltage converters 40 and 42, and voltage outputs are compared by comparator 44 to provide a data output 46.

Figure 6:
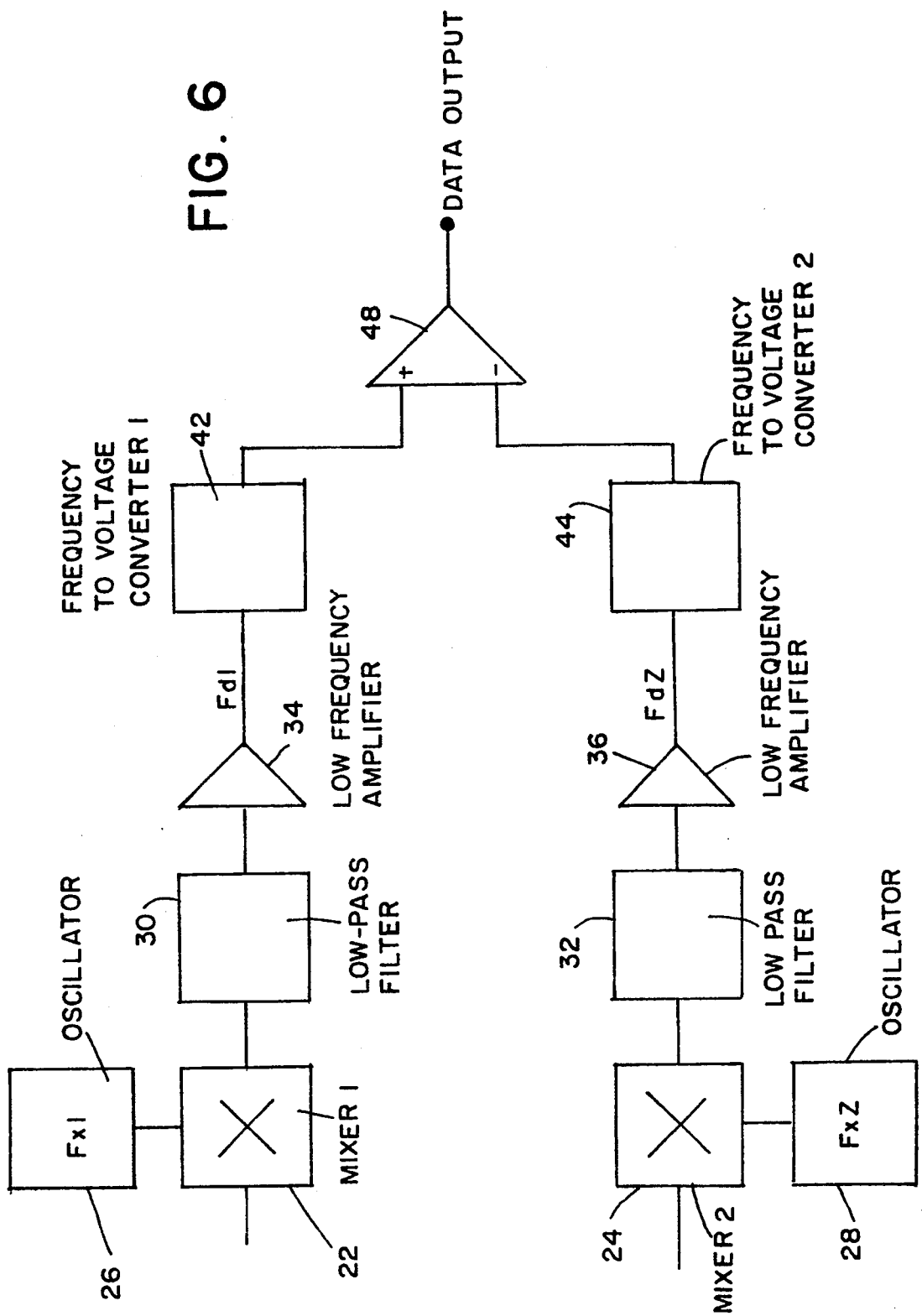
FIG. 6 provides a diagram of an alternative embodiment of the invention, wherein the digital output reading means is a conventional differential operational amplifier for demodulating analog FM modulation.

In FIG. 6 for linear FM demodulation, comparator 44 is replaced by a differential op amp 48.

Figure 3:
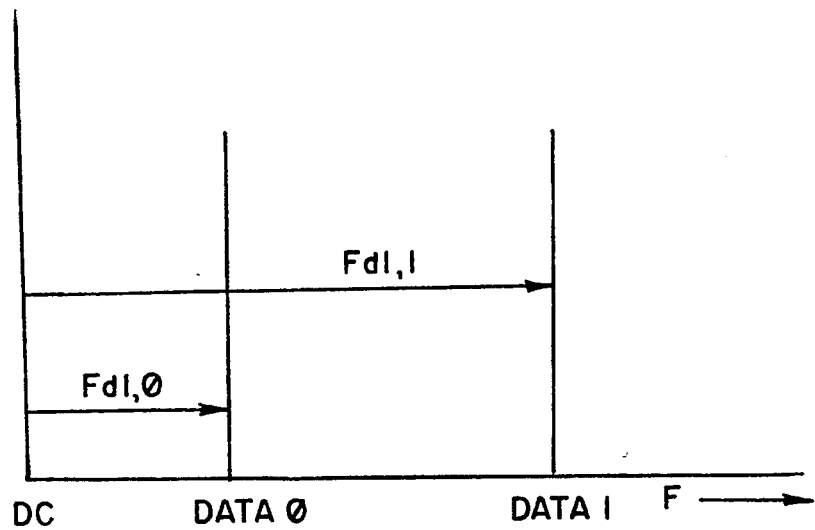
FIG. 3 shows the output of mixer 1, wherein the local oscillator frequency is the zero frequency DC, and the spectral components are folded about the zero frequency.
Figure 4:
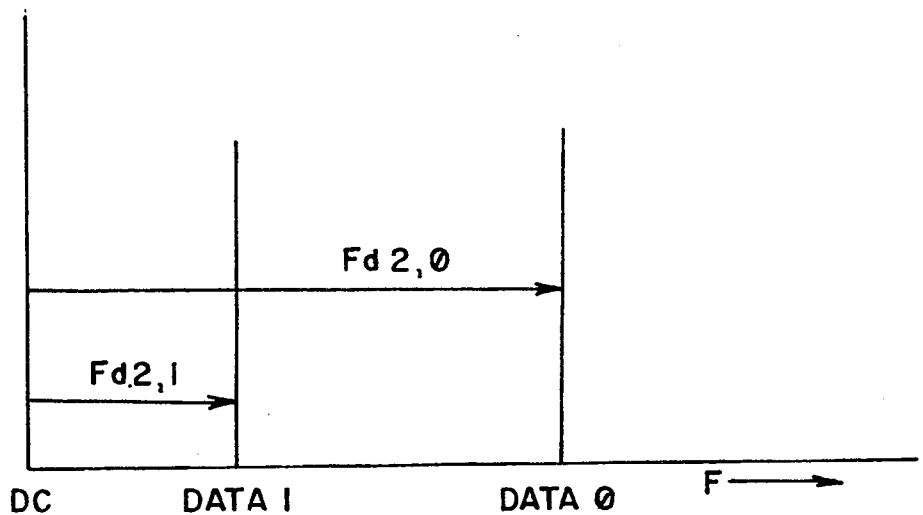
FIG. 4 shows the output of mixer 2.
Figure 7:
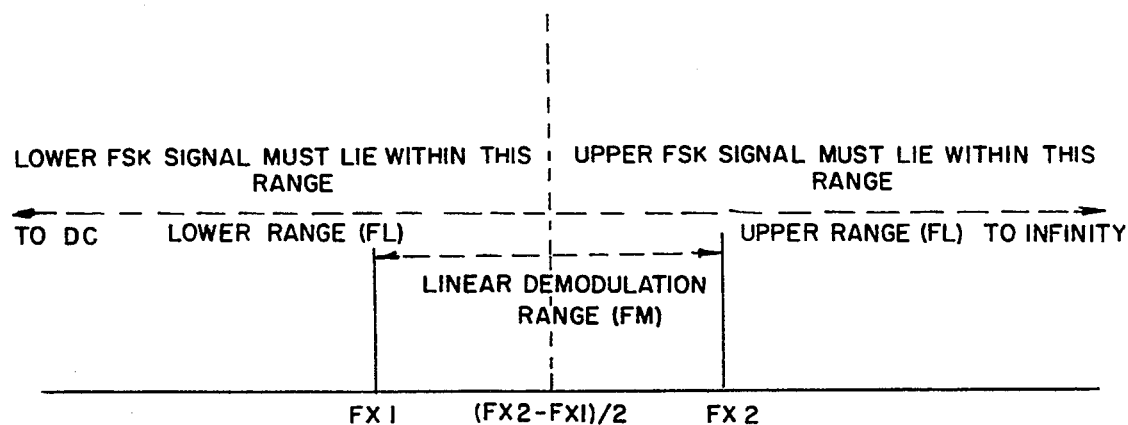
FIG. 7 is a graph wherein demodulation ranges are defined.
Figure 8:
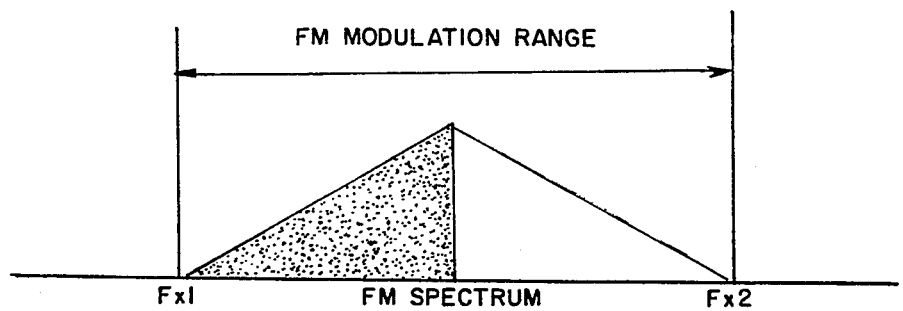
FIG. 8 shows the FM spectrum being between the mixers Fx1 and Fx2.

The multiplication of signals that occurs in the mixers translates the signal spectrum such that in the translated spectrum, what was formerly the local oscillator frequency is now zero frequency (DC) and the spectral components of the original spectrum are folded about the local oscillator frequency as shown in FIGS. 3 and 4. The result is that in the output spectrum of mixer 1, a data 1 signal in the original spectrum is always higher in frequency than a data 0 signal; whereas in the output spectrum of mixer 2, a data 0 is always higher in frequency than a data 1 signal in the original spectrum. This assumes the frequency relationship as shown in FIG. 1; that is, Fx1 < Fx2, and F0 < F1. The relationship of the two mixer frequencies to the information signal to be demodulated must be as shown in FIGS. 7 and 8. That is, for FM modulation, one mixer frequency is above the highest information frequency of interest; whereas the second mixer frequency is below the lowest information frequency of interest. For FSK modulation, the lower FSK signal lies within the frequency band from DC to $$Fx1 + \frac{(Fx2 - Fx1)}{2}$$

and the upper FSK signal must lie in the frequency band $$Fx1 + \frac{(Fx2 - Fx1)}{2}$$

to infinity. In FIG. 2, F Delta, the difference between Fx2 and Fx1, must contain all information frequencies of interest for linear FM demodulation; whereas, for FSK demodulation the F0 signal must be less than $$Fx1 + \frac{(Fx2 - Fx1)}{2}$$

and the F1 signal must be greater than $$Fx1 + \frac{(Fx2 - Fx1)}{2}$$

A frequency relationship that satisfied the following is preferable for FSK demodulation: F0 < Fx1 < Fx2 < F1 and Fos1 = Fos2, with Fos1 and Fos2 chosen to maximize the signal to noise ratio of the information channel, taking into consideration the increase in the demodulator filter bandwidth due to Fos1 and Fos2.

A signal structure is created wherein a data 1 can be discriminated from a data 0 by simply routing each mixer output signal to a frequency-to-voltage converter, and then comparing the relative output powers of each demodulator to determine whether or not a data 1 or a data 0 has been transmitted. This comparison is provided by a low pass filter to eliminate all but the DC component of the signal, and a comparator to determine which mixer channel had the highest level of DC voltage out of the low pass filter.

A demodulator that uses two multivibrators, each with a fixed pulse width that is approximately the same width for each multivibrator, with the outputs connected to an integrator and then the resulting DC voltage compared with a comparator, is an example of a demodulator that could be integrated on the same chip as the rest of the receiver circuit. FIG. 5 shows a circuit using a frequency-to-voltage converter, with the outputs filtered by low pass filters and a comparator to decode whether a data 1 or a data 0 has been transmitted.

As shown in FIG. 6, the circuit may be used to demodulate conventional analog FM modulation. That is accomplished if the comparator in FIG. 5 is replaced with a conventional differential operational amplifier.

While the invention has been described with reference to specific embodiments, modifications and variations of the invention may be constructed without departing from the scope of the invention, which is defined in the following claims.

I claim:

1. An apparatus for frequency demodulation of frequency shift keyed (FSK) data signals, comprising an antenna for receiving the signals, a carrier frequency filter centered on a carrier frequency means connected to the antenna for filtering the signals received from the antenna, an amplifier connected to the filter for amplifying the signals received from the filter and a power divider connected to the amplifier for dividing the amplified signals into first and second respective plural divided outputs, first and second mixers connected to the divider for respectively receiving each of the first and second divided outputs, first and second local oscillators respectively connected to each of the mixers, said first and second mixers each having a respective one of said first and second local oscillators connected thereto, the local oscillators providing signals having different frequencies to the respective mixers for multiplication with the first and second divided outputs whereby first and second multiplied outputs are produced, first and second multiplied output filters and amplifiers respectively connected to each of the oscillators for respectively receiving, filtering and amplifying the first and second multiplied outputs, and first and second frequency-to-voltage converters respectively connected to each of the output filters and amplifiers for converting the filtered and amplified multiplied output frequencies to digital data, and a digital output reader connected to the converters for comparing the digital data output of the first and second converters.

2. The apparatus of claim 1, wherein the multiplied output filters and amplifiers are low pass filters and low frequency amplifiers.

3. The apparatus of claim 2, wherein the digital output reader is a comparator.

4. The apparatus of claim 1, wherein the carrier frequency filter centered on a carrier frequency has a minimum pickup broad enough in frequency response to pass the carrier frequency, as well as upper and lower side band frequencies.

5. The apparatus of claim 1, wherein one of the oscillator frequencies is greater than the carrier frequency, and the other oscillator frequency is less than the carrier frequency.

6. The apparatus of claim 5, wherein the first and second oscillator frequencies are within the minimum range of the signal filter, and wherein frequency differences between the first local oscillator and the carrier frequency and the second local oscillator and the carrier frequency are equal.

7. A dual frequency demodulation apparatus for frequency shift keyed (FSK) data signals, comprising a power divider for dividing the data signals into first and second outputs, first and second mixers respectively connected to first and second local oscillators respectively for respectively multiplying the first and second outputs, the first and second oscillators having different frequencies and producing respective local oscillator signals that are multiplied with the respective first and second divider outputs, wherein the data signals are in a carrier frequency signal and the first and second oscillators have respective frequencies above and below the carrier frequency respectively, first and second frequency-to-voltage converters for respectively converting the multiplied divided outputs to digital data, and a digital data reader for reading the first and second converters for respectively demodulation of the signal.

8. The apparatus of claim 7, further comprising first and second low pass filters and first and second low frequency amplifiers connected to the filters for respectively filtering and amplifying the first and second multiplied outputs prior to conversion to digital data.

9. The apparatus of claim 7, wherein the digital data reader is a comparator.

10. The apparatus of claim 7, further comprising an antenna for receiving the data signals, a filter for filtering the received data signals to a signal centered on the carrier frequency, and an amplifier for amplifying the filtered signal prior to it entering the power divider.

11. A method for dual frequency demodulation of frequency shift keyed (FSK) data signals, comprising receiving signals on an antenna, filtering a carrier frequency, amplifying the signals and dividing the signals using a power divider into first and second divided outputs respectively, multiplying the outputs with first and second mixers respectively, providing first and second multiplied divided outputs respectively, wherein each mixer has a local oscillator with frequencies above and below the carrier frequency respectively, filtering and amplifying the first and second multiplied divided outputs respectively, converting the filtered and amplified multiplied outputs to digital data outputs with first and second frequency-to-voltage converters respectively, and reading the respective digital data output of the first and second converters with a digital output reader.

12. The method of claim 11, wherein the multiplied output filtering and amplifying uses low pass filters and low frequency amplifiers.

13. The apparatus of claim 12, wherein the digital output reading comprises comparing with a comparator.

14. The apparatus of claim 11, wherein the signal filtering is centered on a carrier frequency and provides a minimum pickup broad enough in frequency response for passing the carrier frequency, as well as upper and lower side band frequencies.

15. The apparatus of claim 15, wherein the first and second local oscillators have different frequencies centered on the carrier frequency, wherein one of the oscillator frequencies is greater than the carrier frequency, and the other oscillator frequency is less than the carrier frequency.

16. The apparatus of claim 15, wherein the first and second oscillator frequencies are within the minimum range of the signal filter, and further comprising the frequency differences between the first local oscillator and the carrier frequency and the second local oscillator and the carrier frequency being equal.

17. A method for dual frequency demodulation of frequency shift keyed (FSK) data signals, comprising dividing a signal with a power divider into first and second outputs, multiplying the outputs with respective oscillator signals from first and second local oscillators in first and second mixers respectively, the mixers being connected to said first and second local oscillators respectively, the first and second oscillators having different frequencies, wherein the signal is based respective a carrier signal and the first and second oscillators have frequencies above and below the carrier frequency respectively, converting the multiplied divided outputs to digital data with first and second frequency-to-voltage converters respectively, and reading the respective converted outputs of the first and second converters for demodulation of the signal with a digital data reader.

18. The apparatus of claim 17, further comprising filtering and amplifying the first and second multiplied outputs prior to conversion to digital data with first and second low pass filters and first and second low frequency amplifiers.

19. The apparatus of claim 17, wherein the digital data reading is with a comparator.

20. The apparatus of claim 17, further comprising receiving the signal on an antenna, filtering the received signal to a signal centered on the carrier frequency, and amplifying the filtered signal prior to the dividing.

* * * * *